United States Patent
Harrah et al.

(10) Patent No.: US 6,498,355 B1
(45) Date of Patent: Dec. 24, 2002

(54) HIGH FLUX LED ARRAY

(75) Inventors: Shane Harrah, Menlo Park, CA (US); Douglas P. Woolverton, Mountain View, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/974,563

(22) Filed: Oct. 9, 2001

(51) Int. Cl.⁷ .................. H01L 33/00; H01L 23/495; H01L 23/10; H01L 23/34; H01L 23/48; H01L 23/52; H01L 29/40

(52) U.S. Cl. .............. 257/99; 257/706; 257/707; 257/774; 257/676; 257/88

(58) Field of Search .................. 257/79, 82, 88, 257/117, 184, 254, 99, 100, 676, 706, 707, 774; 3662/364, 365, 368, 373, 800; 438/22, 24, 25, 26, 27, 28, 29, 46, 47

(56) References Cited

U.S. PATENT DOCUMENTS 6,045,240 A * 4/2000 Hochstein ............... 362/294
6,133,589 A    10/2000 Krames et al. .......... 257/103

* cited by examiner

Primary Examiner—Nathan J. Flynn
Assistant Examiner—Victor A. Mandala, Jr.
(74) Attorney, Agent, or Firm—Patent Law Group LLP

(57) ABSTRACT

A light emitting diode array in accordance with the present invention includes a metal substrate, a dielectric layer disposed above the metal substrate, and a plurality of electrically conductive traces disposed on the dielectric layer. A plurality of vias pass through the dielectric layer. The light emitting diode array also includes a plurality of light emitting diodes, each of which is disposed above a corresponding one of said vias and each of which includes a first electrical contact and a second electrical contact electrically coupled to separate ones of the electrically conductive traces. Each of the vias contains a thermally conductive material in thermal contact with the metal substrate and in thermal contact with the corresponding light emitting diode.

25 Claims, 7 Drawing Sheets

HIGH FLUX LED ARRAY

FIELD OF THE INVENTION

The present invention relates to light emitting diodes and more particularly to arrays of light emitting diodes.

BACKGROUND

Arrays of light emitting diodes (LEDs) may be employed in a variety of high flux (optical energy/unit time) applications such as street lighting, traffic signals, and liquid crystal display back-lighting. It is advantageous in such applications to increase the flux provided per unit area of the LED array. Such an increase in flux per unit area can in principle be accomplished by decreasing the spacing between LEDs in the array (thus increasing the number of LEDs per unit area of the array) and/or by increasing the flux provided by the individual LEDs. However, either approach to increasing the flux per unit area of an LED array also typically increases the amount of heat that must be dissipated per unit area of the array to avoid significantly degrading the performance of the LEDs.

One conventional type of LED array includes LED lamps which each comprise a die attached to a metal leadframe within a molded or cast plastic body. The two metal leads of each lamp are typically soldered to conductive traces on a common printed circuit board of conventional design. The space taken up by the lamps' plastic bodies and metal leads limits the packing density of lamps in the array. In addition, such lamps typically cannot dissipate much heat, since heat generated in the lamps is conducted away primarily through the leads and the conductive traces. Consequently, the lamps cannot be driven by high current to produce high flux.

In another conventional type of LED array LED dice are attached with silver filled epoxy to the surface of a conventional printed circuit board. Typically, the LED dice are electrically connected to conductive traces on the printed circuit board with wire bonds which limit how closely the dice may be spaced. In addition, the conventional printed circuit board to which the dice are attached is typically not effective at spreading the heat generated by the LED dice. This limits the maximum operating current of the LED dice and thus the maximum flux provided by an individual LED die.

What is needed is a high flux LED array that does not suffer from the drawbacks of prior art LED arrays.

SUMMARY

An LED array in accordance with the present invention includes a metal substrate, a dielectric layer disposed above the metal substrate, and a plurality of electrically conductive traces disposed on the dielectric layer. A plurality of vias pass through the dielectric layer. The LED array also includes a plurality of LEDs, each of which is disposed above a corresponding one of said vias and each of which includes a first electrical contact and a second electrical contact electrically coupled to separate ones of the electrically conductive traces. Each of the vias contains a thermally conductive material in thermal contact with the metal substrate and in thermal contact with the corresponding LED. The thermally conductive material may include, for example, a solder material.

In some embodiments, the thermally conductive material in a via is in direct physical contact with the metal substrate, in direct physical contact with the corresponding LED, or in direct physical contact with both the metal substrate and the LED. Such direct physical contact is sufficient but not necessary to establish thermal contact.

The thermally conductive material in a via provides an advantageously low thermal resistance path for heat to flow from an LED disposed above the via to the metal substrate, which then effectively conducts the heat away. Consequently, LEDs in arrays in accordance with the present invention may be operated at higher currents and may be spaced closer together than is conventional without raising their temperatures to levels that degrade their performance. Hence, the inventive LED arrays may provide more flux per unit area than is provided by conventional LED arrays.

In some embodiments, a submount is disposed between an LED and the corresponding via and in direct physical contact with the thermally conductive material in the via. Use of such a submount allows incorporation of additional circuitry and testing of the LED prior to installation in the array.

BRIEF DESCRIPTION OF THE DRAWINGS

It should be noted that the dimensions in the figures are not necessarily to scale. Like reference numbers in the various figures denote like parts in the various embodiments.

DETAILED DESCRIPTION

Figure 1:
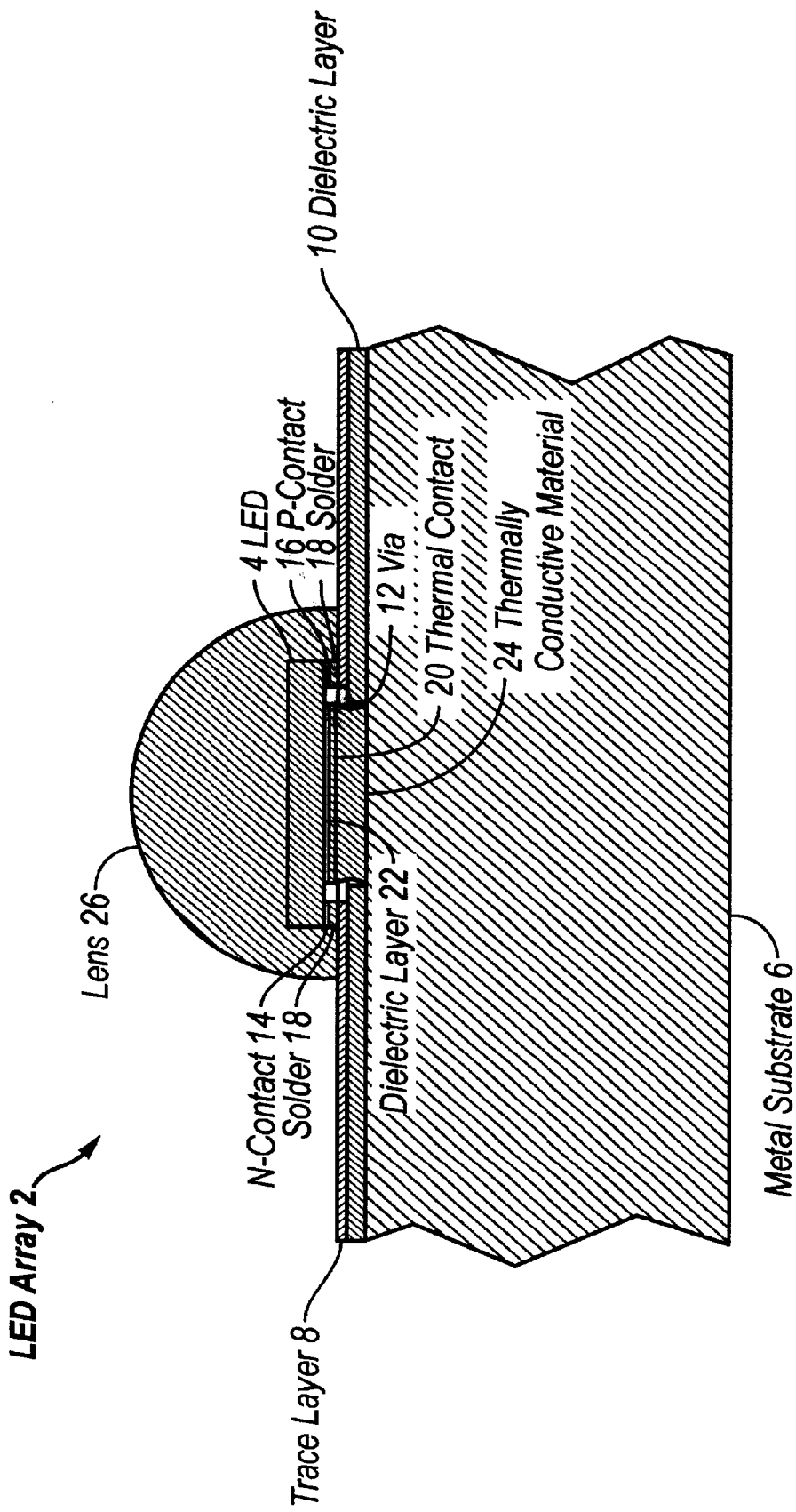
FIG. 1 schematically illustrates a portion of an LED array in accordance with a first embodiment of the present invention.

In one embodiment of the present invention (FIG. 1), an LED array 2 includes a plurality of LEDs (e.g., LED 4) and a metal substrate 6. A layer 8 of conventional conductive electrical traces is disposed on a dielectric layer 10 overlying metal substrate 6. A plurality of vias (e.g., via 12) pass through trace layer 8 and dielectric layer 10 to terminate on or in metal substrate 6. Each of the LEDs is disposed over a corresponding via.

LED 4 may be any suitable conventional light emitting diode. For example, LED 4 may be an AlInGaN LED disclosed in U.S. Pat. No. 6,133,589 or an AlInGaN LED disclosed in U.S. patent application Ser. No. 09/469,657, both of which are assigned to the assignee of the present invention and incorporated herein by reference in their entirety. In some implementations, LED 4 is a high flux AlInGaN or AlInGaP LED driven, for example, by a current greater than about 70 milliamps (mA). Such high flux LEDs are commercially available from, for example, LumiLeds Lighting U.S., LLC of San Jose, Calif.

LED 4 includes conventional N-contact 14 and conventional P-contact 16. In the embodiment illustrated in FIG. 1, LED 4 is mounted as a "flip chip" with N-contact 14 and P-contact 16 disposed on the same side of the LED die and oriented to face trace layer 8. N-contact 14 and P-contact 16 are electrically connected to separate ones of the conductive traces in trace layer 8 with conventional reflowed solder 18. LED 4 also includes thermal contact 20 (e.g., a metal pad) disposed on the same side of LED 4 as contacts 14 and 16. In some implementations thermal contact 20 is electrically isolated from contacts 14 and 16. Such electrical isolation may be provided, for example, by optional dielectric layer 22. Other means of electrically isolating thermal contact 20 from contacts 14 and 16 may also be used. Electrical contacts 14 and 16 and thermal contact 20 may be conventionally formed, for example, from suitable conventional solderable metal layers.

Via 12 contains a thermally conductive material 24 in thermal contact with metal substrate 6 and in thermal contact with LED 4. Thermally conductive material 24 forms part of a continuous solid material heat flow path between LED 4 and metal substrate 6 uninterrupted by, for example, liquid or gas filled gaps. In the embodiment illustrated in FIG. 1, thermally conductive material 24 is in direct contact with thermal contact 20 of LED 4 and in direct contact with metal substrate 6. In other embodiments, however, thermal contact may be established without such direct physical contact between thermally conductive material 24 and LED 4 or metal substrate 6.

In some implementations, thermally conductive material 24 is or includes a conventional reflowed solder deposited in via 12 by conventional means such as, for example, screen printing. In such implementations thermally conductive material 24 may be the same material as used for reflowed solder 18, and conductive material 24 and solder 18 may be deposited in the same process step and reflowed in the same process step. In other implementations, thermally conductive material 24 includes diamond filled epoxy, silver filled epoxy, or other conventional materials having high adhesion strength and good thermal conductivity. In some implementations, thermally conductive material 24 may include metals conventionally plated into via 12. Such plated metals may fill via 12 to, for example, about the level of trace layer 8. Conventional reflowed solder may be deposited on such plated metal in via 12. If thermally conductive material 24 is electrically conductive, it may be electrically isolated from trace layer 8 and LED 4 by dielectric layer 10 and optional dielectric layer 22. If thermally conductive material 24 is a reflowable solder material, the thickness of thermally conductive material 24 between metal substrate 6 and thermal contact 20 is, for example, about 0.0002 inches to about 0.005 inches, typically about 0.001 inches.

Metal substrate 6 is, for example, a copper plate having a thickness greater than about 0.01 inches optionally plated with a solderable material such as nickel or tin to provide good mechanical and thermal contact with thermally conductive material 24. Metal substrate 6 may also be formed from other metals or combinations of metals, and may include two or more metal layers.

In one implementation, trace layer 8 is formed from an etched and plated copper sheet attached to metal substrate 6 with a conventional dielectric adhesive, such as an epoxy, from which dielectric layer 10 is formed. Vias (e.g., via 12) may be formed in trace layer 8 and dielectric layer 10 with conventional machine tools, plasma or chemical etching, or by laser ablation, for example.

LED array 2 may also include lenses (e.g., lens 26) disposed over some or all of the LEDs to collect and direct light emitted by the LEDs. Such lenses may be conventionally cast or molded in clear plastic or elastomer onto some or all of the LEDs. Alternatively, small portions of silicone or similar clear material may be conventionally dispensed onto some or all of the LEDs and then cured to form simple lenses, or hollow clear lenses may be conventionally heat staked, glued, or press fit over some or all of the LEDs and then filled with silicone, for example, to encapsulate the LEDs.

Thermal contact 20 and thermally conductive material 24 provide an advantageously low thermal resistance path for heat to flow from LED 4 to metal substrate 6, which then spreads the heat effectively. The thermal resistance of this path is lower than that of thermal paths in, for example, conventional LED arrays formed on conventional printed circuit boards. This low resistance thermal path allows the LEDs in array 2 to be operated at higher than conventional current (and thus provide higher than conventional flux) without raising their temperatures to levels that degrade their performance. The effective dissipation of heat by thermally conductive material 24 and metal substrate 6 also allows high flux LEDs to be arranged in LED array 2 with a spacing between LEDs less than that in conventional arrays of high flux LEDs without overheating the LEDs and degrading their performance. The absence of separate molded housings, leadframes, and wire bonds to the conductive traces in trace layer 8 for each LED in LED array 2 also allows the LEDs to be spaced more closely. Consequently, LED array 2 may provide a flux per unit area greater than that in conventional LED arrays. The elimination of wire bonds also improves the reliability of LED array 2 in this embodiment, as wire bonds are typically the least reliable elements of LED arrays.

In a second embodiment of the present invention (FIG. 2), each of the LEDs in LED array 2 (e.g., LED 28) is attached to a separate submount (e.g., submount 30). The submounts may be formed, for example, from silicon or ceramic materials. Conventional reflowed solder (e.g., Sn/Pb) bumps 32 electrically connect an N-type region of LED 28 to a top N-contact 34 on submount 30 and electrically connect a P-type region of LED 28 to a top P-contact 36 on submount 30. Vias 38 and 40 in submount 30 each contains a conventional electrically conductive material (e.g., tungsten and/or copper) which carries current from, respectively, top N-contact 34 and top P-contact 36 to, respectively, bottom N-contact 42 and bottom P-contact 44. N-contact 42 and P-contact 44 are electrically connected to separate ones of the traces in trace layer 8 with conventional reflowed solder 18. If submount 30 is formed from a conducting material such as silicon, for example, vias 38 and 40 may include a conventionally deposited dielectric tube or liner to prevent shorting of the vias through the submount.

Submount 30 also includes thermal contact 46 (e.g., a metal pad) disposed on the bottom side of submount 30 adjacent to electrical contacts 42 and 44. In some implementations thermal contact 46 is electrically isolated from contacts 42 and 44. Such electrical isolation may be provided, for example, by optional dielectric layer 48. Other means of electrically isolating thermal contact 46 from contacts 42 and 44 may also be used. Electrical contacts 34, 36, 42, and 44 and thermal contact 46 may be conventionally formed, for example, from suitable conventional solderable metal layers.

In this embodiment thermally conductive material 24 in via 12 is in direct contact with thermal contact 46 on submount 30 and in thermal contact with LED 28 through submount 30 and solder bumps 32. In some implementations, a reflowed solder used in thermally conductive material 24 has a lower reflow temperature than a reflowed solder used in solder bumps 32, allowing submount 30 to be attached to metal substrate 6 without disturbing the solder connections between LED 28 and submount 30. Typically, submount 30 is thin and formed from a thermally conductive material in order to reduce the thermal resistance provided by submount 30 to the flow of heat from LED 28 to metal substrate 6. For example, a submount formed from silicon typically has a thickness less than about 0.010 inches.

The combination of solder bumps 32, submount 30, thermal contact 46, and thermally conductive material 24 provides a low thermal resistance path for heat to flow from LED 28 to metal substrate 6. This low thermal resistance path provides advantages similar to those of the previous embodiment. In addition, LEDs mounted on submounts may be pre-tested prior to installation in LED array 2. Such pre-testing allows the LEDs in LED array 2 to be selected based on well-characterized values for emission wavelength and flux, for example. Also, the submounts may include additional circuitry such as electrostatic discharge protection circuitry, for example, which may be advantageous for LED array 2.

In a third embodiment of the present invention (FIG. 3), vias 38 and 40 are absent and N-contact 34 and P-contact 36 on submount 30 are electrically connected to separate ones of the traces in trace layer 8 by, respectively, wire bonds 48 and 50. Wire bonds 48 and 50 may be less expensive to produce than electrical connections through vias.

In a fourth embodiment of the present invention (FIG. 4), trace layer 8 and dielectric layer 10 are included in a thin conventional printed circuit board or flex circuit 52 attached to metal substrate 6 with a conventional dielectric adhesive layer 54. An additional dielectric layer 56 may overlie trace layer 8. Vias may be formed in printed circuit board 52 by punching, for example.

Figure 2:
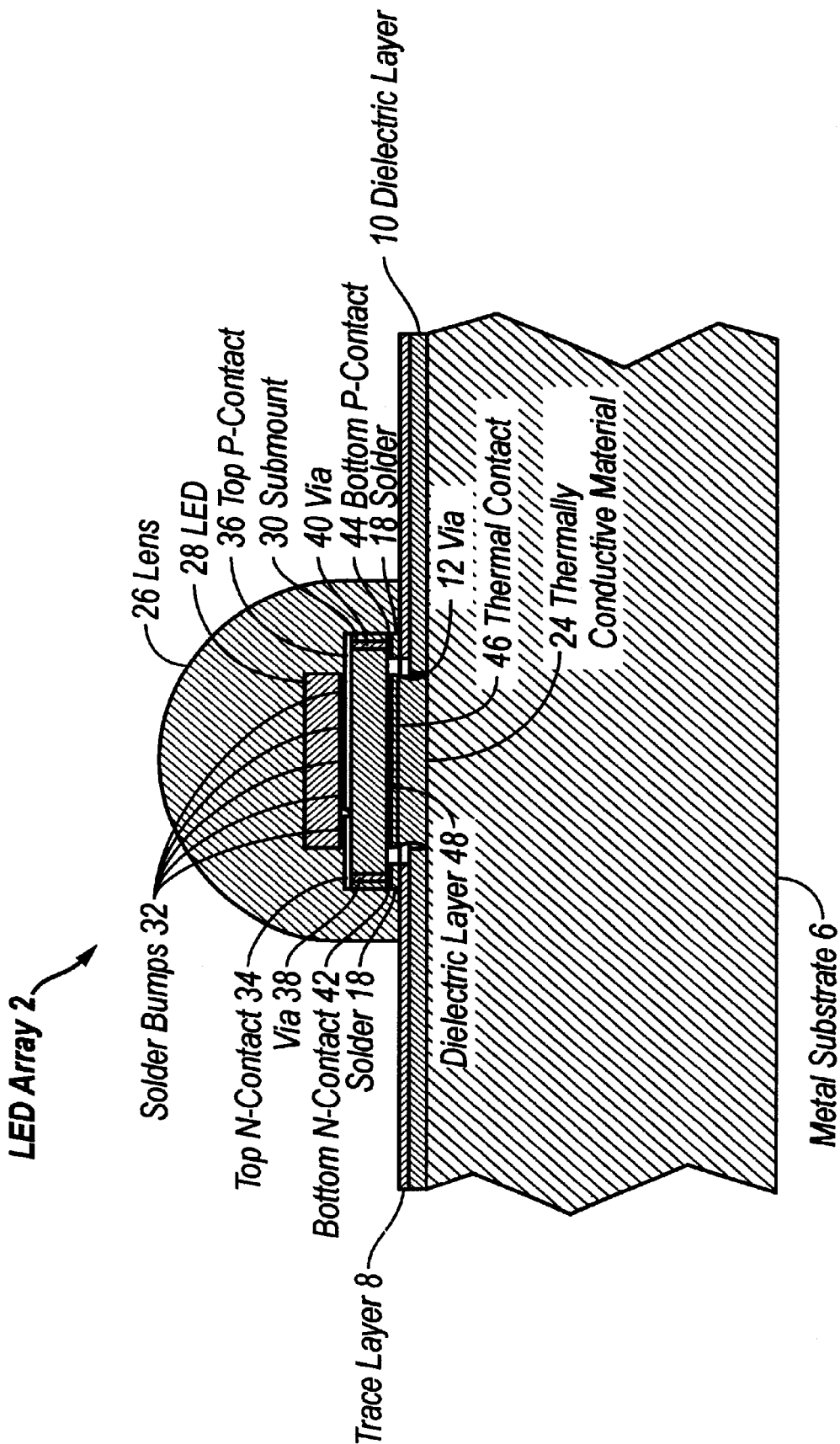
FIG. 2 schematically illustrates a portion of an LED array in accordance with a second embodiment of the present invention.
Figure 3:
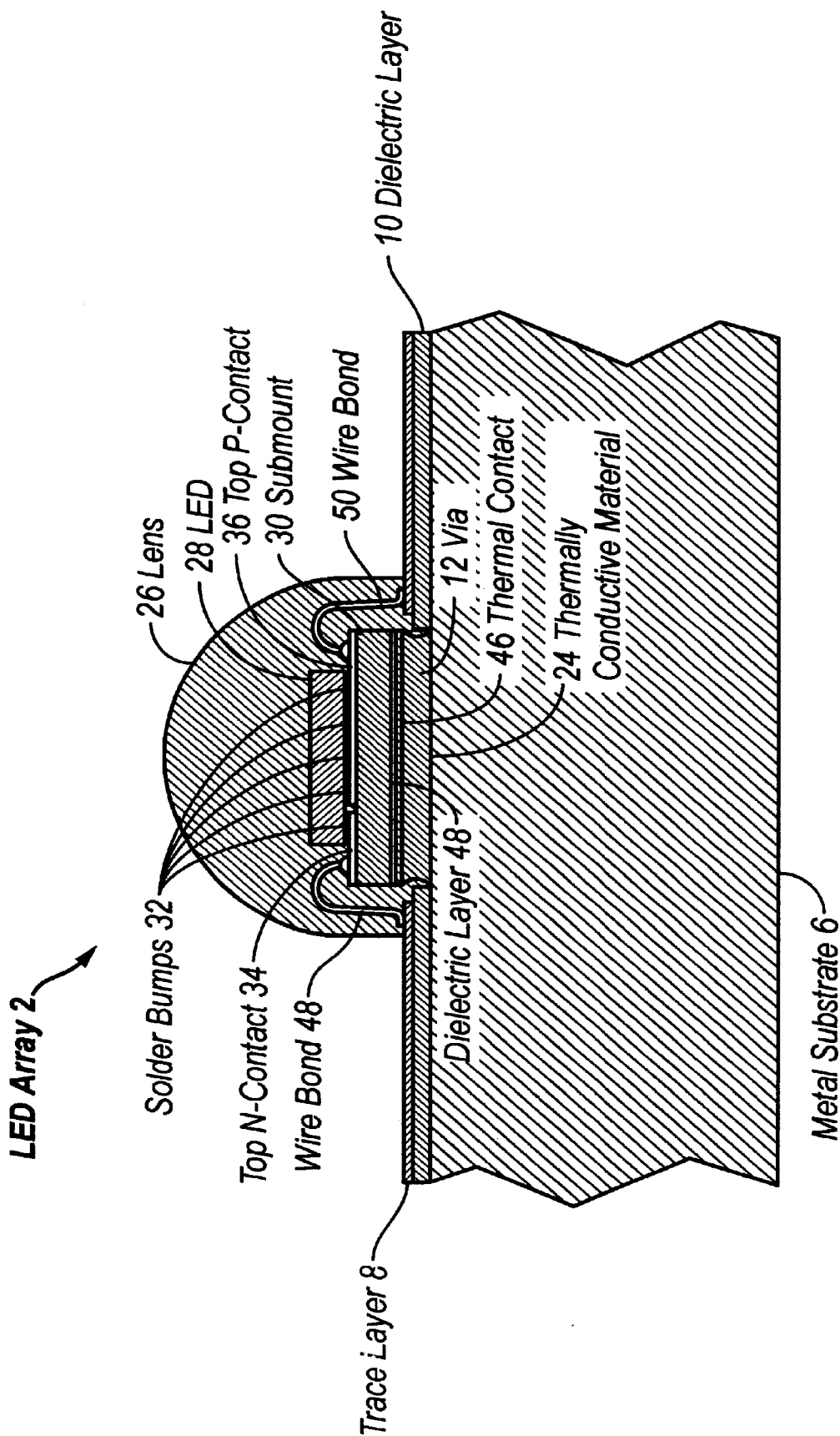
FIG. 3 schematically illustrates a portion of an LED array in accordance with a third embodiment of the present invention.
Figure 4:
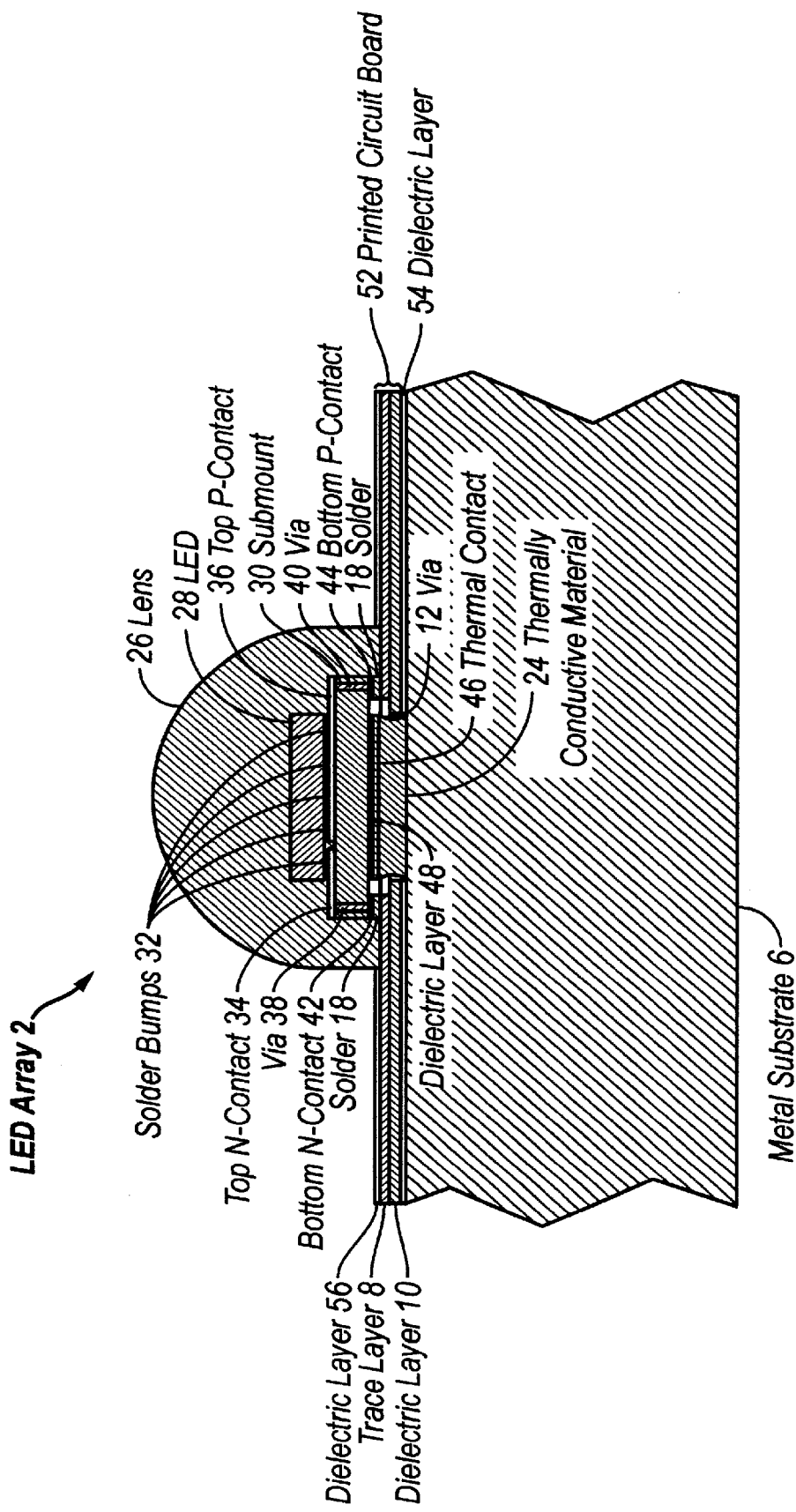
FIG. 4 schematically illustrates a portion of an LED array in accordance with a fourth embodiment of the present invention.
Figure 5:
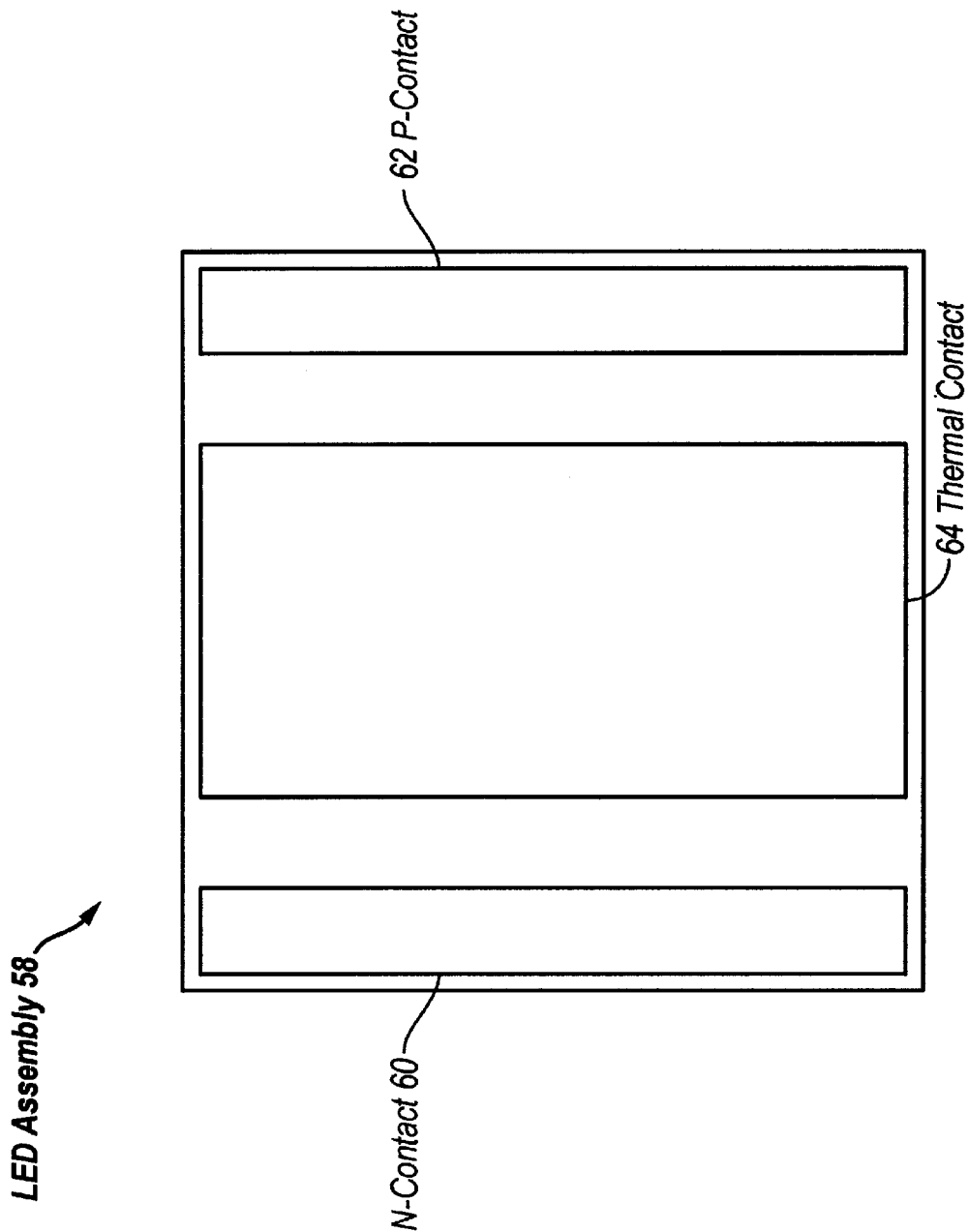
FIG. 5 schematically illustrates a bottom side of an LED or an LED submount in accordance with an embodiment of the present invention.

FIG. 5 schematically illustrates the arrangement of electrical and thermal contacts on the bottom side of an LED assembly 58 included in an LED array in accordance with one embodiment of the present invention. LED assembly 58 may include, for example, an LED without a submount such as LED 4 (FIG. 1) or an LED attached to a submount such as LED 28 attached to submount 30 (FIGS. 2, 3, 4). N-contact 60 may be, for example, N-contact 14 of LED 4 or bottom N-contact 42 of submount 30. P-contact 62 may be, for example, P-contact 16 of LED 4 or bottom P-contact 44 of submount 30. Thermal contact 64 may be, for example, thermal contact 20 of LED 4 or thermal contact 46 of submount 30. Thermal contact 64 typically occupies a large fraction of the bottom surface of LED assembly 58 in order to promote the flow of heat through thermal contact 64 to metal substrate 6.

Figure 6:
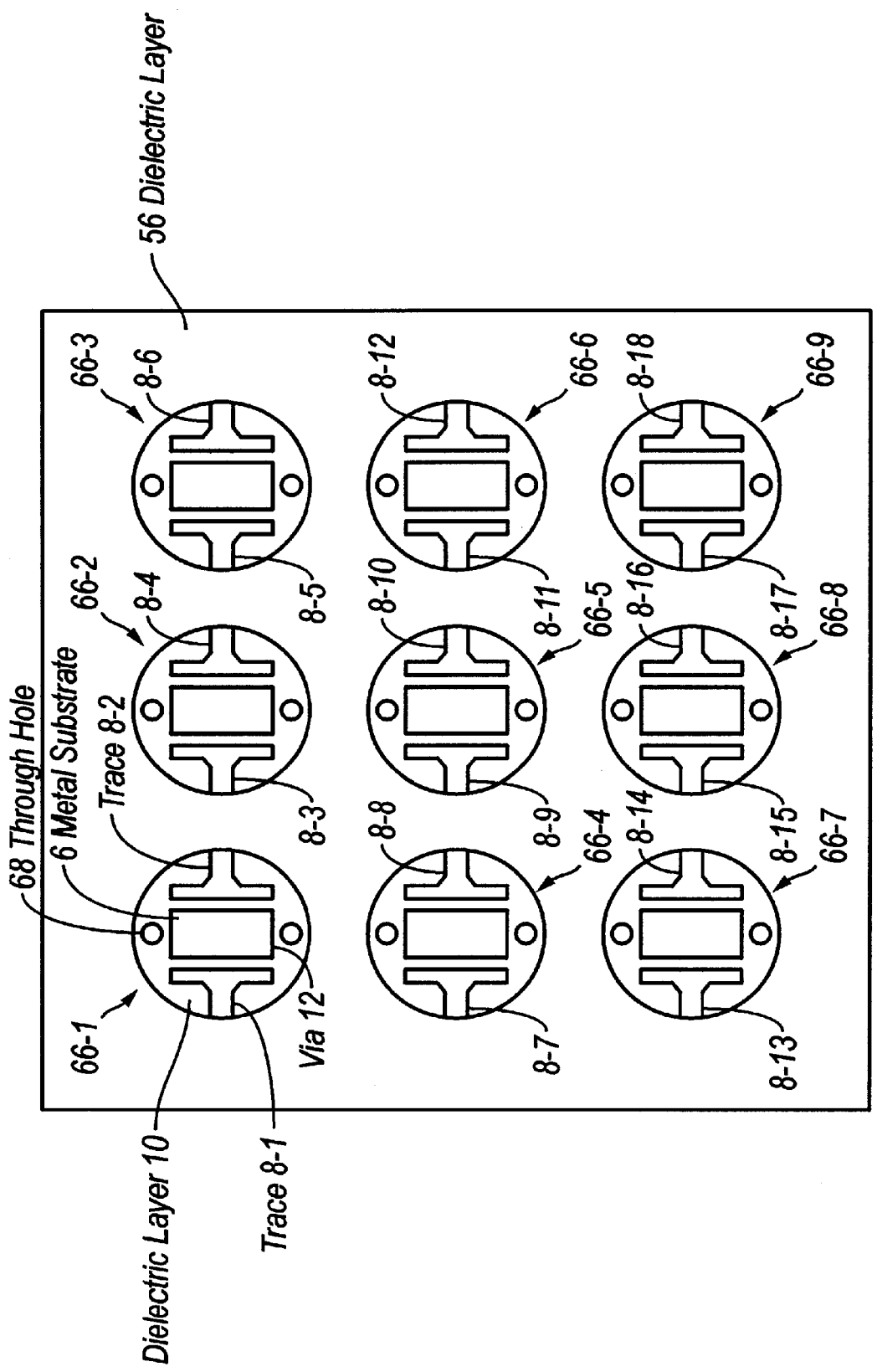
FIG. 6 schematically illustrates in a top view a portion of an LED array in accordance with an embodiment of the present invention.

FIG. 6 schematically illustrates in a top view an LED array 2 in accordance with one embodiment of the present invention prior to installation of LED assemblies (LEDs with or without submounts) at a plurality of locations 66-1–66-9. At each location a via (e.g., via 12) exposes a portion of metal substrate 6. Also, at each location two of conductive traces 8-1–8-18 (in trace layer 8) are exposed to make electrical contact with separate ones of the electrical contacts on the bottom side of an LED assembly such as electrical contacts 60 and 62 of LED assembly 58 (FIG. 5). Conductive electrical traces 8-1–8-18 may be interconnected to put some or all of the LEDs in series, in parallel, or in anti-parallel. Through-holes such as through-hole 68 pass through metal substrate 6 and the dielectric and trace layers overlying metal substrate 6 to allow lenses such as lens 26 (FIG. 1) to be filled with an encapsulant such as silicone, for example.

Figure 7:
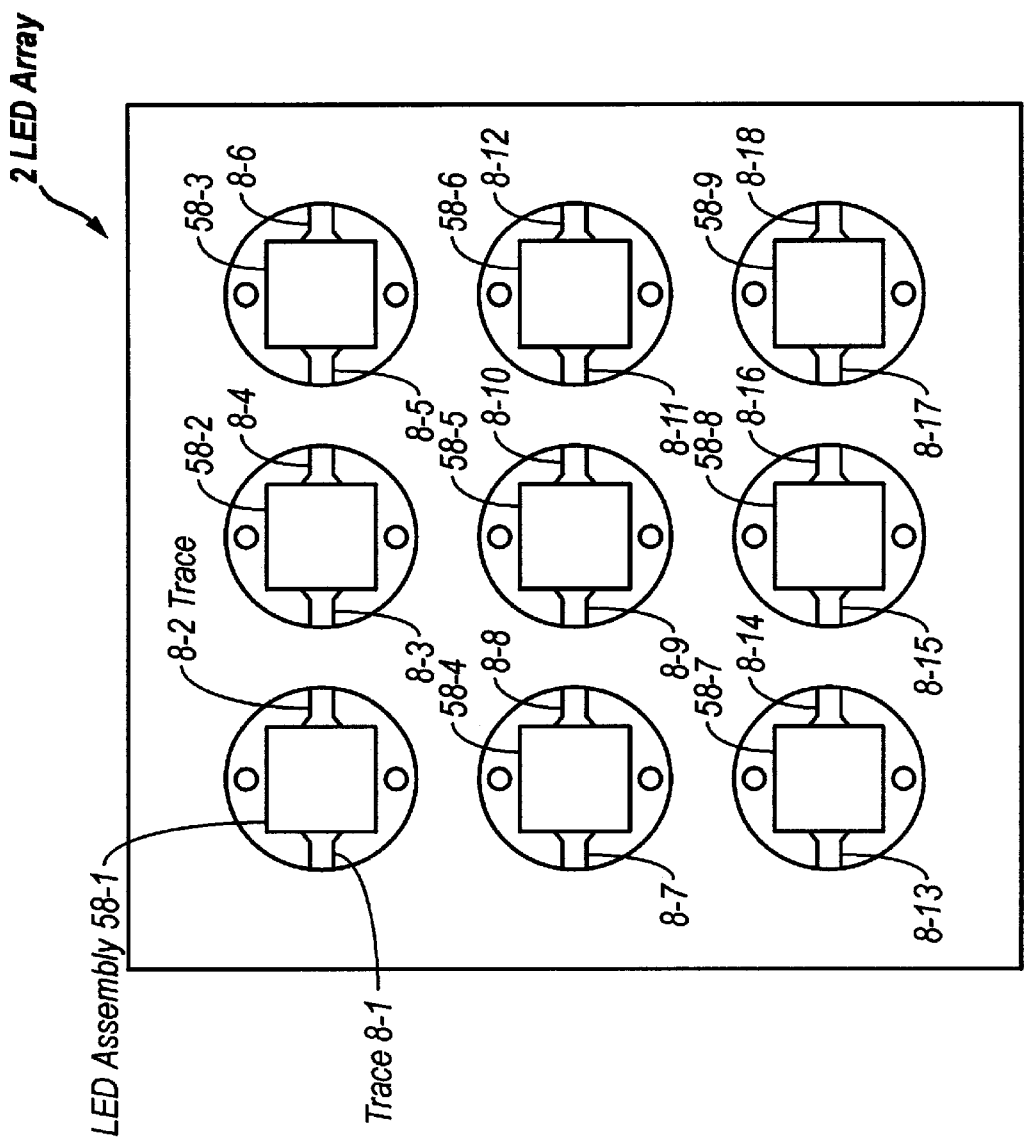
FIG. 7 schematically illustrates in a top view the LED array of FIG. 6.

FIG. 7 schematically illustrates in a top view the LED array 2 of FIG. 6 after attachment of LED assemblies 58-1–58-9 to metal substrate 6 and to conductive traces 8-1–8-16. Each LED assembly is in thermal contact with metal substrate 6 through a thermally conductive material 24 (FIGS. 1–4) deposited in a via located below the LED assembly. In this embodiment, LED array 2 includes 9 LED assemblies (LEDs with or without submounts). Other embodiments include more or fewer than nine such LED assemblies.

While the present invention is illustrated with particular embodiments, the invention is intended to include all variations and modifications falling within the scope of the appended claims. For example, although LEDs 4 and 28 shown in FIGS. 1–4 are flip chips, the present invention may employ LEDs having one or more electrical contacts on a top side of the LED. Such contacts may be wire bonded, for example, to electrical contacts on a submount or to conductive traces in a trace layer overlying the metal substrate. In addition, although FIGS. 2–4 show only one LED attached to each submount, some embodiments may employ more than one LED per submount. In such embodiments some or all of the multiple LEDs on a submount may be electrically connected, for example, in series, in parallel, or in anti-parallel. Moreover, an LED array in accordance with the present invention may include some LEDs disposed on submounts and some LEDs attached directly to the metal substrate. Although FIGS. 1–4 show only one layer 8 of conductive traces disposed above metal substrate 6, other embodiments may employ multiple layers of conductive traces.

We claim:

1. A light emitting diode array comprising:
    a metal substrate;
    a dielectric layer through which pass a plurality of vias, said dielectric layer disposed above said metal substrate;
    a plurality of electrically conductive traces disposed on said dielectric layer; and
    a plurality of light emitting diodes, each having a die within a body, each of which light emitting diodes is disposed above a corresponding one of said vias and each of which includes a first electrical contact and a second electrical contact, said first electrical contact and said second electrical contact electrically coupled to separate ones of said electrically conductive traces;
    wherein each of said vias contains a thermally conductive material in thermal contact with said metal substrate and in direct thermal contact with the body of said corresponding one of said light emitting diodes.

2. The light emitting diode array of claim 1, wherein said metal substrate has a thickness greater than about 0.01 inches.

3. The light emitting diode array of claim 1, wherein at least one of said light emitting diodes includes said first electrical contact and said second electrical contact disposed on a same side of said one of said light emitting diodes and said same side is oriented to face said metal substrate.

4. The light emitting diode array of claim 1, wherein said thermally conductive material in at least one of said vias is electrically isolated from said plurality of conductive traces and electrically isolated from said first and said second electrical contacts of said corresponding one of said light emitting diodes.

5. The light emitting diode array of claim 1, wherein said thermally conductive material includes a solder material.

6. The light emitting diode array of claim 1, wherein said thermally conductive material in at least one of said vias is in direct contact with said corresponding one of said light emitting diodes.

7. The light emitting diode array of claim 1, wherein said thermally conductive material in at least one of said vias is in direct contact with said metal substrate.

8. The light emitting diode array of claim 1, further comprising a submount disposed between one of said light emitting diodes and said corresponding one of said vias and in direct contact with said thermally conductive material in said corresponding one of said vias.

9. The light emitting diode array of claim 8, wherein said submount includes silicon.

10. The light emitting diode array of claim 8, wherein said submount includes vias through which said first electrical contact and said second electrical contact of said one of said light emitting diodes are electrically coupled to said electrically conductive traces.

11. A method of forming a light emitting diode array, the method comprising:
    disposing above a metal substrate a dielectric layer on which are formed a plurality of electrically conductive traces;
    forming a plurality of vias in said dielectric layer, each of said vias exposing said metal substrate;
    introducing into each of said vias a thermally conductive material which makes thermal contact with said metal substrate;
    disposing each of a plurality of light emitting diodes above a corresponding one of said vias such that each light emitting diode is in thermal contact with said thermally conducting material in said corresponding via; and
    for each of said light emitting diodes electrically coupling a first electrical contact and a second electrical contact to separate ones of said electrically conductive traces.

12. The method of claim 11, wherein said metal substrate has a thickness greater than about 0.01 inches.

13. The method of claim 11, further comprising electrically isolating said thermally conductive material in at least one of said vias from said plurality of conductive traces and from said first and said second electrical contacts of said corresponding one of said light emitting diodes.

14. The method of claim 11, further comprising introducing a solder material into at least one of said vias.

15. The method of claim 11, further comprising disposing at least one of said light emitting diodes such that it is in direct contact with said thermally conducting material in said corresponding via.

16. The method of claim 11, wherein said thermally conductive material in at least one of said vias is in direct contact with said metal substrate.

17. The method of claim 11, further comprising disposing a submount between one of said light emitting diodes and said corresponding one of said vias such that said submount is in direct contact with said thermally conductive material in said corresponding one of said vias.

18. The method of claim 17, further comprising forming said submount from silicon.

19. The method of claim 17, further comprising forming vias in said submount through which said first electrical contact and said second electrical contact of said one of said light emitting diodes are electrically coupled to said electrically conductive traces.

20. The method of claim 11, each of the light emitting diodes having a die within a body, wherein the body of each light emitting diode is in direct contact with said thermally conducting material in said corresponding via.

21. A light emitting diode array comprising:
    a metal substrate;
    a dielectric layer through which pass a plurality of vias, said dielectric layer disposed above said metal substrate;
    a plurality of electrically conductive traces disposed on said dielectric layer; and
    a plurality of light emitting diodes, each of which light emitting diodes is disposed above a corresponding one of said vias and each of which includes a first electrical contact and a second electrical contact, said first electrical contact and said second electrical contact electrically coupled to separate ones of said electrically conductive traces;
    wherein each of said vias contains a thermally conductive material in thermal contact with said metal substrate and in thermal contact with said corresponding one of said light emitting diodes;
    wherein said thermally conductive material in at least one of said vias is electrically isolated from said plurality of conductive traces and electrically isolated from said first and said second electrical contacts of said corresponding one of said light emitting diodes.

22. A light emitting diode array comprising:
    a metal substrate;
    a dielectric layer through which pass a plurality of vias, said dielectric layer disposed above said metal substrate;
    a plurality of electrically conductive traces disposed on said dielectric layer; and
    a plurality of light emitting diodes, each of which light emitting diodes is disposed above a corresponding one of said vias and each of which includes a first electrical contact and a second electrical contact, said first electrical contact and said second electrical contact electrically coupled to separate ones of said electrically conductive traces;
    wherein each of said vias contains a thermally conductive material in thermal contact with said metal substrate and in thermal contact with said corresponding one of said light emitting diodes;
    wherein said thermally conducting material includes a solder material.

23. A light emitting diode array comprising:
    a metal substrate;
    a dielectric layer through which pass a plurality of vias, said dielectric layer disposed above said metal substrate;
    a plurality of electrically conductive traces disposed on said dielectric layer; and
    a plurality of light emitting diodes, each of which light emitting diodes is disposed above a corresponding one of said vias and each of which includes a first electrical contact and a second electrical contact, said first electrical contact and said second electrical contact electrically coupled to separate ones of said electrically conductive traces;

wherein each of said vias contains a thermally conductive material in thermal contact with said metal substrate and in thermal contact with said corresponding one of said light emitting diodes;

wherein said thermally conducting material in at least one of said vias is in direct contact with said corresponding one of said light emitting diodes.

24. A light emitting diode array comprising:

a metal substrate;

a dielectric layer through which pass a plurality of vias, said dielectric layer disposed above said metal substrate;

a plurality of electrically conductive traces disposed on said dielectric layer; and a plurality of light emitting diodes, each of which light emitting diodes is disposed above a corresponding one of said vias and each of which includes a first electrical contact and a second electrical contact, said first electrical contact and said second electrical contact electrically coupled to separate ones of said electrically conductive traces;

wherein each of said vias contains a thermally conductive material in thermal contact with said metal substrate and in thermal contact with said corresponding one of said light emitting diodes;

wherein said thermally conductive material in at least one of said vias is in direct contact with said metal substrate.

25. A light emitting diode array comprising:

a metal substrate;

a dielectric layer through which pass a plurality of vias, said dielectric layer disposed above said metal substrate;

a plurality of electrically conductive traces disposed on said dielectric layer; and a plurality of light emitting diodes, each of which light emitting diodes is disposed above a corresponding one of said vias and each of which includes a first electrical contact and a second electrical contact, said first electrical contact and said second electrical contact electrically coupled to separate ones of said electrically conductive traces;

wherein each of said vias contains a thermally conductive material in thermal contact with said metal substrate and in thermal contact with said corresponding one of said light emitting diodes;

further comprising a submount disposed between one of said light emitting diodes and said corresponding one of said vias and in direct contact with said thermally conductive material in said corresponding one of said vias.

* * * * *